(12) United States Patent
Hauser et al.

(10) Patent No.: US 12,278,178 B2
(45) Date of Patent: Apr. 15, 2025

(54) FUSE ELEMENT FOR PROCESS-INDUCED DAMAGE PROTECTION STRUCTURE

(71) Applicant: GlobalFoundries U.S. Inc., Malta, NY (US)

(72) Inventors: Michael J. Hauser, Albany, NY (US); Michael J. Zierak, Colchester, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 409 days.

(21) Appl. No.: 17/809,610

(22) Filed: Jun. 29, 2022

(65) Prior Publication Data

US 2024/0006309 A1 Jan. 4, 2024

(51) Int. Cl.
*H01L 23/525* (2006.01)
*H01L 23/522* (2006.01)
*H01L 23/528* (2006.01)
*H01L 23/62* (2006.01)

(52) U.S. Cl.
CPC ...... *H01L 23/5256* (2013.01); *H01L 23/5226* (2013.01); *H01L 23/528* (2013.01); *H01L 23/62* (2013.01)

(58) Field of Classification Search
CPC ............. H01L 23/5256; H01L 23/5226; H01L 23/528; H01L 27/0207; H01L 23/62
See application file for complete search history.

(56) References Cited

U.S. PATENT DOCUMENTS

| 5,998,299 | A | 12/1999 | Krishnan | |
|---|---|---|---|---|
| 6,288,436 | B1* | 9/2001 | Narayan | H01L 23/5258 257/E23.149 |
| 6,448,599 | B1 | 9/2002 | Wang | |
| 6,586,267 | B2 | 7/2003 | Krishnan | |
| 7,282,751 | B2* | 10/2007 | Ueda | H01L 23/525 257/209 |
| 2002/0061630 | A1* | 5/2002 | Lee | H01L 27/0255 438/467 |

(Continued)

FOREIGN PATENT DOCUMENTS

KR 101161743 B1 7/2012

OTHER PUBLICATIONS

Johnson et al. Basic Electric Circuit Analysis (Year: 1984).*

*Primary Examiner* — Galina G Yushina
(74) *Attorney, Agent, or Firm* — Anthony Canale; Hoffman Warnick LLC

(57) ABSTRACT

An integrated circuit (IC) structure includes a transistor in a device layer over a substrate, the transistor including a gate; and a plurality of interconnect layers over the device layer, the plurality of interconnect layers including a last metal layer. A process-induced damage (PID) protection structure includes a conductor coupling the gate to a well in the substrate but includes an open fuse element therein. A first metal interconnect extends from a first terminal of the open fuse element to a first pad in the last metal layer, and a second metal interconnect extending from a second terminal of the open fuse element to a second pad in the last metal layer. The fuse element is closed during fabrication, and the metal interconnects allow opening of the fuse element to deactivate the PID protection structure after fabrication.

20 Claims, 2 Drawing Sheets

(56) References Cited

U.S. PATENT DOCUMENTS

2007/0063313 A1* 3/2007 Barth ................. H01L 23/5256
                                                        257/209
2017/0040261 A1* 2/2017 Iwamoto ........... H01L 23/53238
2017/0336467 A1* 11/2017 Mikalo ................ H01L 23/528

* cited by examiner

FUSE ELEMENT FOR PROCESS-INDUCED DAMAGE PROTECTION STRUCTURE

BACKGROUND

The present disclosure relates to integrated circuits (ICs), and more particularly, to an IC structure including a fuse element for selectively disconnecting a process-induced damage protection structure.

In integrated circuit fabrication, process induced damage (PID) can occur during manufacture of certain structures, such as back-end-of-line (BEOL) interconnect layers above a first metal layer, and may reduce yield. PID can take the form of, for example, electrostatic charge that damages sensitive structures within the IC structure. Current approaches to protect against PID include adding protection structures, such as forming reverse bias diode or similar structure with a conductor coupling the transistor gate to the local substrate to direct any electrostatic charge to ground. The presence of the reverse bias diode in the final IC product presents other challenges such as increased parasitic harmonics based on its non-linear operation and an inability to use the transistor in a reverse mode, e.g., for an n-type field effect transistor (nFET), where pulling the gate negative will forward bias the diode. Where a reverse bias diode is not possible, design rule restrictions create limited viable options relative to changing other structure. For example, one approach attempts to adjust total metal area versus oxide area (i.e., metal via, line and/or gate area versus oxide area) to protect against PID. The changing of structures within an IC structure disadvantageously adds restrictions to the design and performance of the final product. Other approaches attempt to control fabrication tools to reduce PID with limited efficacy.

SUMMARY

All aspects, examples and features mentioned below can be combined in any technically possible way.

An aspect of the disclosure provides an integrated circuit (IC) structure, comprising: a transistor in a device layer at least part of which is over a substrate, the transistor including a gate; a plurality of interconnect layers over the device layer, the plurality of interconnect layers including a last metal layer; the gate coupled to a well in the substrate through a conductor which includes a fuse; a first metal interconnect extending from a first terminal of the open fuse element to a first pad in the last metal layer; and a second metal interconnect extending from a second terminal of the open fuse element to a second pad in the last metal layer.

Another aspect of the disclosure includes any of the preceding aspects, and the first terminal, the second terminal and a portion of the conductor are in a first metal layer of the plurality of interconnect layers.

Another aspect of the disclosure includes any of the preceding aspects, and the first metal interconnect and the first terminal are on a first side of the open fuse element closest to the gate, and the second metal interconnect and the second terminal are on a second side of the open fuse element farther from the gate than the first metal interconnect and the first terminal, wherein a voltage applied between the first and second pads created the open fuse element.

Another aspect of the disclosure includes any of the preceding aspects, and a potential applied to the second pad is a positive potential.

Another aspect of the disclosure includes any of the preceding aspects, and the well includes an n-well in the substrate.

Another aspect of the disclosure includes any of the preceding aspects, and the conductor includes a metal wire in a first metal layer of the plurality of interconnect layers, and a conductive via coupling the metal wire to the substrate.

Another aspect of the disclosure relates to a process-induced damage (PID) protection structure for an integrated circuit (IC) structure, the PID protection structure comprising: a transistor in a device layer at least part of which is over a substrate, the transistor including a gate; the gate coupled by a conductor to a well in the substrate, the conductor including a fuse element; a first metal interconnect extending from a first terminal of the fuse element through a plurality of interconnect layers over the device layer to a first pad in a last metal layer; and a second metal interconnect extending from a second terminal of the fuse element through the plurality of interconnect layers over the device layer to a second pad in the last metal layer.

Another aspect of the disclosure includes any of the preceding aspects, and the first terminal, the second terminal and a portion of the conductor are in a first metal layer of the plurality of interconnect layers.

Another aspect of the disclosure includes any of the preceding aspects, and the first metal interconnect and the first terminal are on a first side of the open fuse element closest to the gate, and the second metal interconnect and the second terminal are on a second side of the open fuse element farther from the gate than the first metal interconnect and the first terminal.

Another aspect of the disclosure includes any of the preceding aspects, and the fuse element is placed in the open state by applying a voltage between the first and second pads.

Another aspect of the disclosure includes any of the preceding aspects, and the well includes an n-well in the substrate.

Another aspect of the disclosure includes any of the preceding aspects, and the conductor includes a metal wire in a first metal layer of the plurality of interconnect layers, and a conductive via coupling the metal wire to the well in the substrate.

Another aspect of the disclosure includes any of the preceding aspects, and the PID protection structure is a reverse bias diode.

Another aspect includes a method, comprising: forming a process-induced damage (PID) protection structure including a transistor including a gate in a device layer at least part of which is over a substrate, and a conductor connecting the gate to a well in the substrate, the conductor including a fuse element therein; forming a plurality of interconnect layers over the device layer, the plurality of interconnect layers including a last metal layer, wherein forming the plurality of interconnect layers includes forming: a first metal interconnect extending from a first terminal of the fuse element to a first pad in the last metal layer, and a second metal interconnect extending from a second terminal of the fuse element to a second pad in the last metal layer; and after forming the last metal layer, applying a voltage between the first and second pads to disconnect the fuse element, creating an open fuse element.

Another aspect of the disclosure includes any of the preceding aspects, and the first terminal, the second terminal and a portion of the conductor are in a first metal layer of the plurality of interconnect layers.

Another aspect of the disclosure includes any of the preceding aspects, and the first metal interconnect and the first terminal are on a first side of the open fuse element closest to the gate, and the second metal interconnect and the second terminal are on a second side of the open fuse element farther from the gate than the first metal interconnect and the first terminal.

Another aspect of the disclosure includes any of the preceding aspects, and the fuse element is placed in the open state by applying a positive potential to the second pad.

Another aspect of the disclosure includes any of the preceding aspects, and the well includes an n-well in the substrate.

Another aspect of the disclosure includes any of the preceding aspects, and the conductor includes a metal wire in a first metal layer of the plurality of interconnect layers, and a conductive via coupling the metal wire to the substrate.

Another aspect of the disclosure includes any of the preceding aspects and creating the open fuse element deactivates the PID protection structure.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
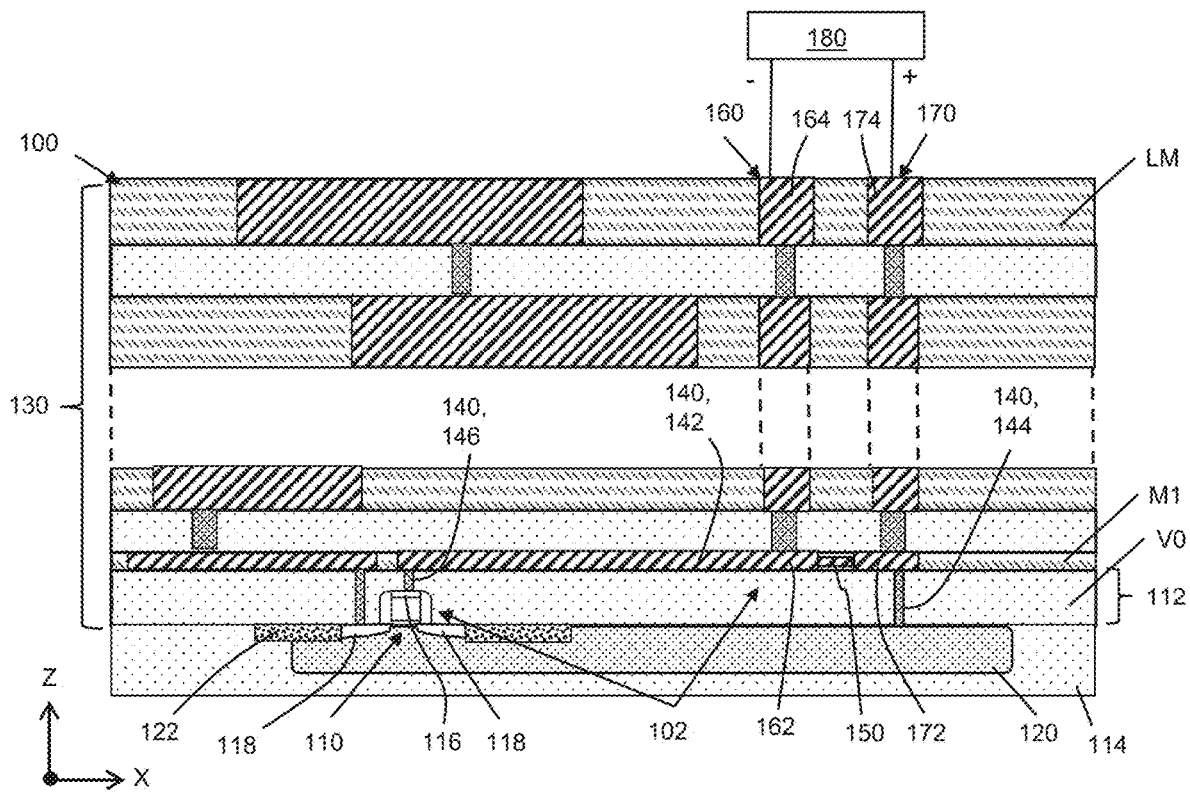
FIG. 1 shows a cross-sectional view of an intermediate IC structure including a PID protection structure, after fabrication, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure includes an integrated circuit (IC) structure including a transistor in a device layer over a substrate, the transistor including a gate. A plurality of interconnect layers, e.g., middle-of-line (MOL) and/or back-end-of-line (BEOL) layers, are over the device layer and include a last metal layer. A deactivated process-induced damage (PID) protection structure includes a conductor coupling the gate to a well in the substrate but includes an open fuse element therein, i.e., a fuse element in an open state. A first metal interconnect extends from a first terminal of the open fuse element to a first pad in the last metal layer, and a second metal interconnect extending from a second terminal of the open fuse element to a second pad in the last metal layer. The fuse element is closed during fabrication allowing the PID protection structure to operate as intended. After fabrication, the metal interconnects allow opening of the fuse element to deactivate the PID protection structure. The teachings of the disclosure allow use of a PID protection structure(s) while eliminating the non-ideal consequences, such as parasitic impedance, capacitance, inability to operate devices in accumulation (reverse bias mode), when the PID protection structure(s) remain in the final product.

Figure 2:
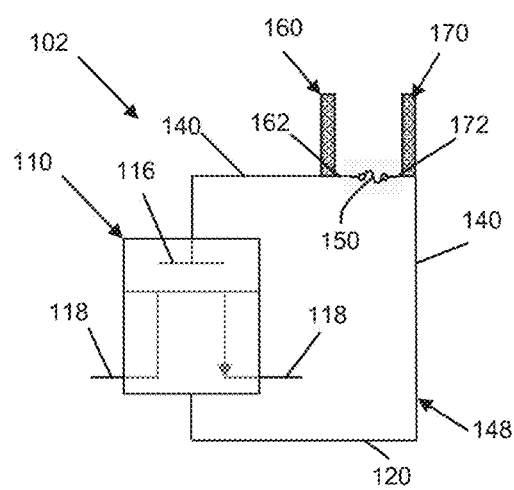
FIG. 2 shows a schematic view of a PID protection structure, after fabrication, according to embodiments of the disclosure.

FIG. 1 shows a cross-sectional view of an intermediate IC structure 100 including a PID protection structure 102, after fabrication, and FIG. 2 shows a schematic view of PID protection structure 102, according to embodiments of the disclosure. Intermediate IC structure 100 and PID protection structure 102 may include a transistor 110 in a device layer 112, at least part of which is over a substrate 114. Transistor 110 may include any now known or later developed metal-oxide semiconductor field effect transistor (MOSFET). Transistor 110 includes a gate 116. Gate 116 may take any polyconductor form, e.g., metal gate or polysilicon. Transistor 110 may also include source/drain regions 118 formed within a well 120 in substrate. Well 120 can take either polarity, i.e., n-type or p-type, but will be referenced as n-type for purposes of description. Transistor 110 may be isolated from other devices by trench isolations 122.

Intermediate IC structure 100 includes a plurality of interconnect layers 130 over device layer 112. Plurality of interconnect layers 130 may include any number of MOL and/or BEOL layers and includes a last metal layer LM. Each layer 130 includes a dielectric material, e.g., oxide, having interconnects such as metal wires, e.g., copper, aluminum, etc., running laterally therethrough or metal contacts, e.g., tungsten, running vertically therethrough. Appropriate refractory metal liner(s) (not shown) such as tantalum, titanium nitride, etc., may line the metal wires and contacts to prevent electromigration. Only some of layers 130 are shown as indicated by the vertical dashed lines. Intermediate IC structure 100, as shown in FIG. 1, can be formed using any now known or later developed semiconductor fabrication techniques.

Intermediate IC structure 100 and PID protection structure 102 thereof may also include a conductor 140 coupling gate 116 to well 120 in substrate 114. As shown in FIG. 2, conductor 140 from gate 116 to well 120, e.g., n-well, of substrate 114 creates a reverse bias diode 148. That is, PID protection structure 102 is a reverse bias diode 148. Diode 148 protects transistor 110 from process induced damage during fabrication, such as electrostatic discharge or related damage. FIG. 1 shows intermediate IC structure 100 after fabrication. Conductor 140 can include any number of metal wires in first metal layer M1 of plurality of interconnect layers 130, and/or contacts necessary to couple gate 116 to well 120. More specifically, conductor 140 includes a metal wire 142 in a first metal layer M1, and one or more conductive via(s) 144 coupling metal wire 142 to substrate 114, e.g., well 120. Conductor 140 may also include one or more conductive via(s) 146 for coupling metal wire 142 to gate 116. Conductive via(s) 144, 146 may be in a local interconnect layer V0. Metal wire 142 and conductive via(s) 144, 146 may include any of the afore-described materials for layers 130.

In accordance with embodiments of the disclosure, conductor 140 of PID protection structure 102 also includes a fuse element 150 therein. Fuse element 150 can include any now known or later developed fusing structure, such as but not limited to a thinner portion within metal wire 142 capable of disconnection upon application of a threshold voltage. While shown as a vertically narrowed structure, fuse element 150 can be alternatively, or in addition thereto, narrowed in a lateral direction (into and out of page). First terminal 162, second terminal 172 of fuse element 150 and a portion of conductor 140, e.g., metal wire 142, are in first metal layer M1.

Intermediate IC structure 100 and PID protection structure 102 also include a first metal interconnect 160 extending from a first terminal 162 of fuse element 150 to a first pad 164 in last metal layer LM, and a second metal interconnect 170 extending from a second terminal 172 of fuse element 150 to a second pad 174 in last metal layer LM. First metal interconnect 160 and first terminal 162 are on a first side of fuse element 150 closest to gate 116, and second metal interconnect 170 and second terminal 172 are on a second side of fuse element 150 farther from gate 116 than first metal interconnect 160 and first terminal 162. Each metal interconnect 160, 170 may include any number of metal wires and contacts arranged in any manner extending through interconnect layers 130. In certain embodiments, contacts of metal interconnects 160, 170 include a minimal area contact to minimize metal area versus oxide area to protect against PID. Each pad 164, 174 is accessible in last metal layer LM for application of a voltage thereto from any now known or later developed voltage source 180.

A method according to embodiments of the disclosure may include forming intermediate IC structure 100 and PID protection structure 102. As described, PID protection structure 102 may include transistor 110 including gate 116 in device layer 112, at least part of which is over substrate 114, and conductor 140 connecting gate 116 to well 120 in substrate 114. Conductor 140 includes fuse element 150 therein. As understood, intermediate IC structure 100 may include a large and wide variety of other integrated circuit elements (not shown) such as but not limited to other transistors, capacitors, and resistors, that collectively form an integrated circuit.

A method may also include forming a plurality of interconnect layers 130 over device layer 112. Layers 130 include last metal layer LM. Forming layers 130 also include forming first metal interconnect 160 extending from first terminal 162 of fuse element 150 to first pad 164 in last metal layer LM, and second metal interconnect 170 extending from second terminal 172 of fuse element 150 to second pad 174 in last metal layer LM. Any number of layers 130 may be formed. Intermediate IC structure 100 and PID protection structure 102 may be formed using any now known or later developed semiconductor fabrication techniques. During the fabrication process, PID protection structure 102 protects transistor 110 and other structure from process induced damage such as but not limited to electrostatic discharge and related. PID protection structure 102 protects transistor 110 by grounding gate 116 thereof to substrate 114, e.g., n-well 120, directing any damaging electric current into substrate during fabrication.

Figure 3:
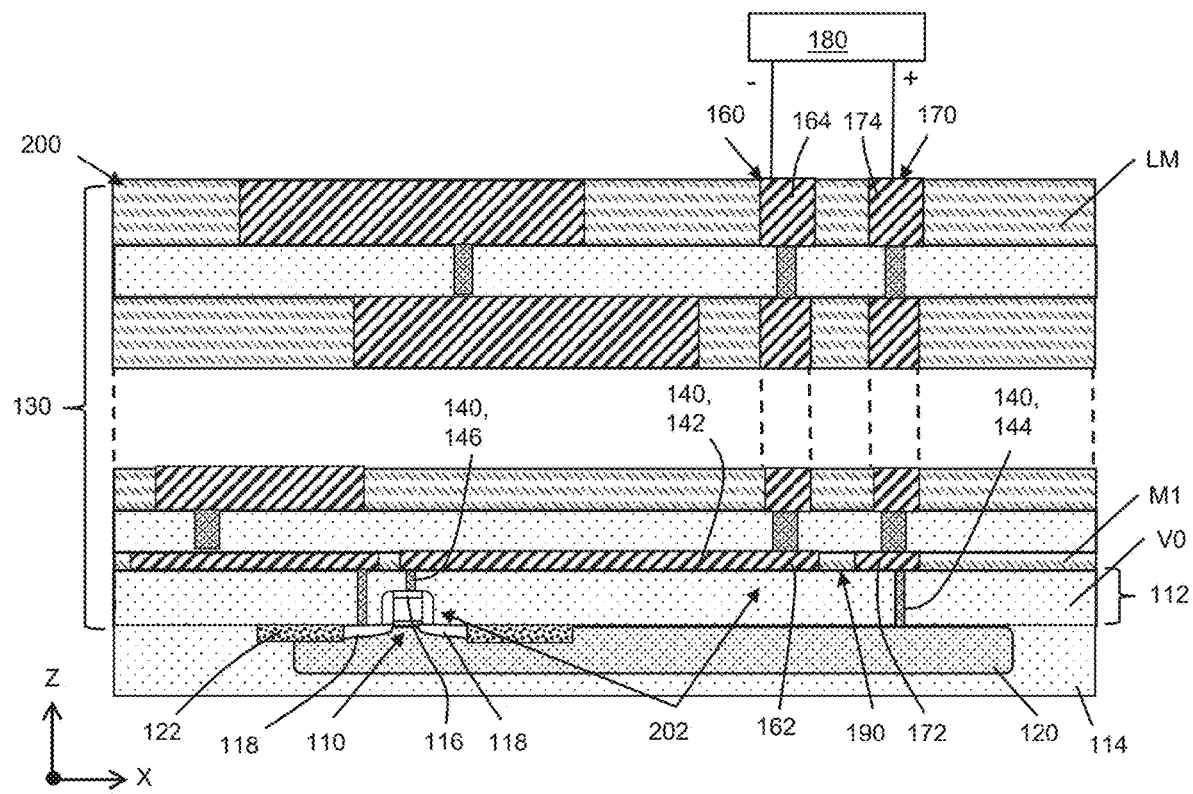
FIG. 3 shows a cross-sectional view of an IC structure including a deactivated PID protection structure after disconnection of a fuse element, according to embodiments of the disclosure.
Figure 4:
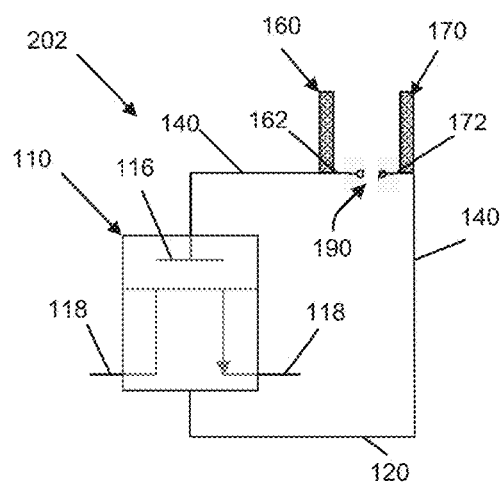
FIG. 4 shows a schematic view of a deactivated PID protection structure, after disconnection of a fuse element, according to embodiments of the disclosure.

After forming last metal layer LM, a voltage is applied, i.e., by voltage source 180, to second pad 174 to disconnect fuse element 150, creating an open fuse element 190. That is, fuse element 190 is in an open, non-conducting state. FIG. 3 shows a cross-sectional view of IC structure 200 including deactivated PID protection structure 202, and FIG. 4 shows a schematic view of deactivated PID protection structure 202, after disconnecting fuse element 150 (FIGS. 1-2), according to embodiments of the disclosure. Fuse element 150 (FIGS. 1-2) may be disconnected (e.g., blown) by applying a positive voltage to second metal interconnect 170, second terminal 172 of fuse element 150 and to well 120 via second pad 174. Similarly, a negative voltage is consequently applied to first metal interconnect 160, first terminal 162 of fuse element 150 and to gate 116 via first pad 164. Hence, gate 116 and transistor 110 are at negative/ground voltage protecting them from damage during deactivation of PID protection structure 102 (FIGS. 1-2). Voltage source 180 is used to apply the voltages to first and second pads 164, 174. Creating open fuse element 190 disconnects gate 116 from well 120 and creates IC structure 200 with deactivated PID protection structure 202 (FIGS. 3-4).

With reference to FIGS. 3 and 4, IC structure 100 including deactivated PID protection structure 202 are shown in the way they exist in a final product, according to embodiments of the disclosure. IC structure 200 and deactivated PID protection structure 202 may include transistor 110 in device layer 112, at least part of which is over substrate 114. As noted, transistor 110 may include any now known or later developed metal-oxide semiconductor field effect transistor (MOSFET). Transistor 110 also includes gate 116. As noted, gate 116 may take any polyconductor form, e.g., metal gate or polysilicon. Transistor 110 may also include source/drain regions 118 formed within well 120 in substrate. Well 120 can take either polarity, i.e., n-type or p-type, but has been referenced herein as n-type. IC structure 200 includes a plurality of interconnect layers 130 over device layer 112, as described herein. As noted, plurality of interconnect layers 130 may include any number of MOL and/or BEOL layers and includes last metal layer LM.

IC structure 200 and deactivated PID protection structure 202 may include conductor 140 coupling gate 116 to well 120 in substrate 114, i.e., but for open fuse element 190. Conductor 140 can include any number of metal wires in first metal layer M1, and/or contacts necessary to couple gate 116 to well 120. More specifically, conductor 140 includes metal wire 142 in first metal layer M1, and conductive via(s) 144, 146 coupling metal wire 142 to substrate 114, e.g., well 120, but for open fuse element 190. Conductive via(s) 144, 146 may be in local interconnect layer V0. In accordance with embodiments of the disclosure, conductor 140 also includes open fuse element 190 therein. In this manner, PID protection structure 102 (FIGS. 1-2) is no longer active. First terminal 162, second terminal 172 of fuse element 190 and a portion of conductor 140, e.g., metal wire 142, are in first metal layer M1.

IC structure 200 and deactivated PID protection structure 202 also include first metal interconnect 160 extending from first terminal 162 of open fuse element 190 to first pad 164 in last metal layer LM, and second metal interconnect 170 extending from second terminal 172 of open fuse element 190 to second pad 174 in last metal layer LM. First metal interconnect 160 and first terminal 162 are on a first side of open fuse element 190 closest to gate 116, and second metal interconnect 170 and second terminal 172 are on a second side of open fuse element 190 farther from gate 116 than first metal interconnect 160 and first terminal 162. As noted, each metal interconnect 160, 170 may include any number of metal wires and contacts arranged in any manner extending through interconnect layers 130.

Embodiments of the disclosure provide various technical and commercial advantages, examples of which are discussed herein. For example, embodiments of the disclosure use a PID protection structure 102 during fabrication, but only provides the deactivated PID protection structure in the final product. Hence, a quality PID protection structure can be used during fabrication, while also eliminating the non-ideal consequences such as parasitic impedance, capacitance, inability to operate devices in accumulation (reverse bias mode), where the PID protection structure remains in the final product. The teachings of the disclosure also provide a simple and low-cost solution that does not require additional considerations relative to design rules and performance of the final product.

The method and structures as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. An integrated circuit (IC) structure, comprising:
   a transistor in a device layer at least part of which is over a substrate, the transistor including a gate;
   a plurality of interconnect layers over the device layer, the plurality of interconnect layers including a last metal layer;
   the gate coupled to a well in the substrate through a conductor which includes a fuse element;

a first metal interconnect extending from a first terminal of the fuse element to a first pad in the last metal layer; and a second metal interconnect extending from a second terminal of the fuse element to a second pad in the last metal layer.

2. The IC structure of claim 1, wherein the first terminal, the second terminal and a portion of the conductor are in a first metal layer of the plurality of interconnect layers.

3. The IC structure of claim 1, wherein the first metal interconnect and the first terminal are on a first side of the open fuse element closest to the gate, and the second metal interconnect and the second terminal are on a second side of the open fuse element farther from the gate than the first metal interconnect and the first terminal, wherein a voltage applied between the first and second pads created the open fuse element.

4. The IC structure of claim 3, wherein the a potential applied to the second pad is a positive potential.

5. The IC structure of claim 1, wherein the well includes an n-well in the substrate.

6. The IC structure of claim 1, wherein the conductor includes a metal wire in a first metal layer of the plurality of interconnect layers, and a conductive via coupling the metal wire to the substrate.

7. A process-induced damage (PID) protection structure for an integrated circuit (IC) structure, the PID protection structure comprising:

a transistor in a device layer at least part of which is over a substrate, the transistor including a gate;

the gate coupled by a conductor to a well in the substrate, the conductor including a fuse element;

a first metal interconnect extending from a first terminal of the fuse element through a plurality of interconnect layers over the device layer to a first pad in a last metal layer; and a second metal interconnect extending from a second terminal of the fuse element through the plurality of interconnect layers over the device layer to a second pad in the last metal layer.

8. The PID protection structure of claim 7, wherein the first terminal, the second terminal and a portion of the conductor are in a first metal layer.

9. The PID protection structure of claim 7, the first metal interconnect and the first terminal are on a first side of the open fuse element closest to the gate, and the second metal interconnect and the second terminal are on a second side of the open fuse element farther from the gate than the first metal interconnect and the first terminal.

10. The PID protection structure of claim 7, wherein the fuse element is placed in the open state by applying a voltage between the first and second pads.

11. The PID protection structure of claim 7, wherein the well includes an n-well in the substrate.

12. The PID protection structure of claim 7, wherein the conductor includes a metal wire in a first metal layer of the plurality of interconnect layers, and a conductive via coupling the metal wire to the well in the substrate.

13. The PID protection structure of claim 7, wherein the PID protection structure is a reverse bias diode.

14. A method, comprising:

forming a process-induced damage (PID) protection structure including a transistor including a gate in a device layer at least part of which is over a substrate, and a conductor connecting the gate to a well in the substrate, the conductor including a fuse element therein;

forming a plurality of interconnect layers over the device layer, the plurality of interconnect layers including a last metal layer, wherein forming the plurality of interconnect layers includes forming:

a first metal interconnect extending from a first terminal of the fuse element to a first pad in the last metal layer, and a second metal interconnect extending from a second terminal of the fuse element to a second pad in the last metal layer; and after forming the last metal layer, applying a voltage between the first and second pads to disconnect the fuse element, creating an open fuse element.

15. The method of claim 14, wherein the first terminal, the second terminal and a portion of the conductor are in a first metal layer.

16. The method of claim 14, wherein the first metal interconnect and the first terminal are on a first side of the open fuse element closest to the gate, and the second metal interconnect and the second terminal are on a second side of the open fuse element farther from the gate than the first metal interconnect and the first terminal.

17. The method of claim 14, wherein the a potential applied to the second pad is a positive potential.

18. The method of claim 14, wherein the well includes an n-well in the substrate.

19. The method of claim 14, wherein the conductor includes a metal wire in a first metal layer of the plurality of interconnect layers, and a conductive via coupling the metal wire to the substrate.

20. The method of claim 14, wherein creating the open fuse element deactivates the PID protection structure.

* * * * *